(12) United States Patent
Han et al.

(10) Patent No.: US 12,557,484 B2
(45) Date of Patent: Feb. 17, 2026

(54) DISPLAY SUBSTRATE, DISPLAY SUBSTRATE MOTHERBOARD AND MANUFACTURING METHOD THEREFOR, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Linhong Han, Beijing (CN); Yi Zhang, Beijing (CN); Weiyun Huang, Beijing (CN); Yiyang Zhang, Beijing (CN); Yue Long, Beijing (CN); Youngyik Ko, Beijing (CN); Shikai Qin, Beijing (CN); Yuqing Yang, Beijing (CN); Pengfei Yu, Beijing (CN); Yang Zhou, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 652 days.

(21) Appl. No.: 17/771,973

(22) PCT Filed: Mar. 8, 2021

(86) PCT No.: PCT/CN2021/079527
§ 371 (c)(1),
(2) Date: Apr. 26, 2022

(87) PCT Pub. No.: WO2021/190285
PCT Pub. Date: Sep. 30, 2021

(65) Prior Publication Data
US 2022/0399416 A1    Dec. 15, 2022

(30) Foreign Application Priority Data

Mar. 23, 2020    (CN) .......................... 202010209938.X (51) Int. Cl.
*H10K 59/124*    (2023.01)
*H10K 59/131*    (2023.01)
(Continued)

(52) U.S. Cl.
CPC ......... *H10K 59/124* (2023.02); *H10K 59/131* (2023.02); *H10K 59/873* (2023.02);
(Continued)

(58) Field of Classification Search
CPC .. H10K 59/124; H10K 50/844; H10K 59/131; H10K 71/00; H10K 59/1201;
(Continued)

(56) References Cited

U.S. PATENT DOCUMENTS

2017/0351379 A1    12/2017  Chen et al.
2018/0101036 A1*    4/2018  Wang ................ G02F 1/133345
(Continued)

FOREIGN PATENT DOCUMENTS

CN    107808896 A  *  3/2018  ............. H10K 59/12
CN    110783275 A      2/2020
(Continued)

OTHER PUBLICATIONS

PCT International Search Report and Written Opinion (with English translations) for corresponding PCT Application No. PCT/CN2021/079527, mailed Jun. 9, 2021, 16 pages.

*Primary Examiner* — Mohammad M Hoque
(74) *Attorney, Agent, or Firm* — Dority & Manning, P.A.

(57) ABSTRACT

A display substrate includes a substrate, at least one inorganic film, metal film(s) and organic film(s), the at least one inorganic film is disposed on the substrate; at least one edge
(Continued)

portion of the entire at least one inorganic film is step-shaped. The metal film(s) are disposed on a side of the at least one inorganic film facing away from the substrate. A metal film includes a conductive pattern and residual pattern(s), and an orthographic projection of a residual pattern on the substrate is located within an orthographic projection of a step-shaped edge portion of the at least one inorganic film on the substrate. An organic film is disposed on a side of the metal film facing away from the substrate, and an edge portion of the organic film covers the residual pattern of the metal film.

17 Claims, 7 Drawing Sheets

(51) Int. Cl.
    *H10K 59/80*         (2023.01)
    *H10K 71/00*         (2023.01)
    *H10K 59/12*         (2023.01)
    *H10K 77/10*         (2023.01)
    *H10K 102/00*       (2023.01)

(52) U.S. Cl.
    CPC .......... *H10K 71/00* (2023.02); *H10K 59/1201* (2023.02); *H10K 71/851* (2023.02); *H10K 77/111* (2023.02); *H10K 2102/311* (2023.02)

(58) Field of Classification Search
    CPC ............... H10K 71/851; H10K 77/111; H10K 2102/311; H10K 59/873; A23B 11/86; H10D 10/821; H10D 86/021; H10F 77/337; C01G 45/022
    USPC .......................................................... 257/72
    See application file for complete search history.

(56) References Cited

U.S. PATENT DOCUMENTS

2020/0019281 A1\*   1/2020   Miyamoto ............. H05B 33/02
2021/0408490 A1   12/2021   Zhang et al.

FOREIGN PATENT DOCUMENTS

| CN | 110796949 A | 2/2020 |
|---|---|---|
| CN | 211238254 U | 8/2020 |

\* cited by examiner

DISPLAY SUBSTRATE, DISPLAY SUBSTRATE MOTHERBOARD AND MANUFACTURING METHOD THEREFOR, AND DISPLAY DEVICE

CROSS-REFERENCE TO RELATED APPLICATIONS

This application is a national phase entry under 35 USC 371 of International Patent Application No. PCT/CN2021/079527, filed on Mar. 8, 2021, which claims priority to Chinese Patent Application No. 202010209938.X, filed on Mar. 23, 2020, which are incorporated herein by reference in their entirety.

TECHNICAL FIELD

The present disclosure relates to the field of display technologies, and in particular, to a display substrate, a display substrate motherboard and a manufacturing method therefor, and a display device.

BACKGROUND

In a manufacturing process of display devices, whether they are thin film transistor liquid crystal display (TFT-LCD) devices or organic light-emitting diode (OLED) display devices, the display devices are manufactured in a motherboard and then cut and separated, so as to further complete subsequent processes. In this way, production efficiency of the display devices is improved and production costs are reduced.

SUMMARY

In an aspect, a display substrate is provided. The display substrate includes a substrate, at least one inorganic film, at least one metal film, and at least one organic film. The at least one inorganic film is disposed on the substrate; at least one edge portion of the entire at least one inorganic film is step-shaped. The at least one metal film is disposed on a side of the at least one inorganic film facing away from the substrate. A metal film includes a conductive pattern and at least one residual pattern, and an orthographic projection of a residual pattern on the substrate is located within an orthographic projection of a step-shaped edge portion of the at least one inorganic film on the substrate. An organic film is disposed on a side of the metal film facing away from the substrate, and an edge portion of the organic film covers the residual pattern of the metal film.

In some embodiments, in a direction parallel to the substrate and pointing from a center of the at least one inorganic film to a boundary of the step-shaped edge portion of the at least one inorganic film, a thickness of the step-shaped edge portion of the at least one inorganic film decreases in a stepped manner.

In some embodiments, an orthographic projection of a boundary of the step-shaped edge portion of the at least one inorganic film on the substrate approximately coincides with a boundary of a respective side of the substrate.

In some embodiments, a space exists between an orthographic projection, on the substrate, of a boundary of the edge portion of the organic film covering the residual pattern and a boundary of a respective side of the substrate.

In some embodiments, the at least one inorganic film includes at least one of a barrier film, a buffer film, a gate insulating film and an interlayer insulating film.

In some embodiments, the at least one metal film includes at least two metal films, and the at least one organic film includes at least two organic films. Each metal film and a respective organic film form a film layer pair; in the film pair, the organic film is disposed on a side of the metal film facing away from the substrate, and covers the residual pattern of the metal film. In the at least two metal films, two adjacent metal films are a first metal film and a second metal film, the second metal film is disposed at a side of the first metal film facing away from the substrate; in the at least two organic films, an organic film between the first metal film and the second metal film is a first organic film. A residual pattern of the second metal film is disposed on a surface of the first organic film facing away from the substrate, and/or disposed on a surface of a portion, not covered by the first organic film, of the step-shaped edge portion of the at least one inorganic film.

In some embodiments, a conductive pattern of the first metal film includes at least one conductive electrode and at least one signal line. The at least one conductive electrode includes at least one of a source and a drain. The at least one signal line includes at least one of a data signal line, a voltage signal line, a clock signal line, and a sensing signal line. A conductive pattern of the second metal film includes at least one of at least one connection electrode, at least one initialization signal line and at least one auxiliary signal line.

In some embodiments, in a thickness direction of the substrate and away from the substrate, the step-shaped edge portion of the at least one inorganic film includes a first step, a second step and a third step. An outer boundary of the second step is indented toward a middle of the substrate relative to an outer boundary of the first step, and an outer boundary of the third step is indented toward the middle of the substrate relative to the outer boundary of the second step.

In some embodiments, in the at least two organic films, an organic film on a side of the second metal film facing away from the substrate is a second organic film. A residual pattern of the first metal film is located on the second step; an edge portion of the first organic film extends onto the first step; the residual pattern of the second metal film is located on the first step; and an edge portion of the second organic film at least partially covers the first step.

In some embodiments, the at least one inorganic film includes a barrier film, a buffer film, a gate insulating film and an interlayer insulating film that are stacked in sequence. The barrier film includes a main body portion and at least one edge portion, an edge portion of the barrier film includes a connection portion connected to the main body portion of the barrier film, and a recess portion located on a side of the connection portion away from the main body portion of the barrier film, a thickness of the connection portion is greater than a thickness of the recess portion; the recess portion constitutes the first step. A boundary of an orthographic projection of the buffer film on the barrier film approximately coincides with a boundary of the connection portion of the barrier film; an edge portion of the buffer film close to the recess portion and the connection portion together constitute the second step. A boundary of an orthographic projection of the gate insulating film on the buffer film and a respective boundary of an orthographic projection of the interlayer insulating film on the buffer film are located on a side of a boundary of the buffer film proximate to the middle of the buffer film; an edge portion of the gate insulating film and an edge portion of the interlayer insulating film that are close to the recess portion together constitute the third steps.

In some embodiments, the interlayer insulating film includes a first interlayer insulating sub-film and a second interlayer insulating sub-film, and the second interlayer insulating sub-film is disposed on a side of the first interlayer insulating sub-film facing away from the substrate. The display substrate further includes: a semiconductor pattern disposed on a surface of the buffer film facing away from the substrate; a first gate pattern disposed on a surface of the gate insulating film facing away from the substrate, the first interlayer insulating sub-film covering the first gate pattern; and a second gate pattern disposed on a surface of the first interlayer insulating sub-film facing away from the substrate, the second interlayer insulating sub-film covering the second gate pattern. A conductive pattern of the first metal film is located on a surface of the second interlayer insulating sub-film facing away from the substrate, and a conductive electrode of the conductive pattern of the first metal film is connected to the semiconductor pattern.

In some embodiments, the display substrate further includes a passivation film, the passivation film is disposed on a side of the conductive pattern of the metal film facing away from the substrate, and the organic film is located on a side of the passivation film facing away from the substrate. Or the display substrate further includes a passivation film, the at least one metal film includes at least two metal films, and the at least one organic film includes at least two organic films; the passivation film is disposed on a side of a conductive pattern of an innermost metal film facing away from the substrate, and an outermost organic film is located on the side of the passivation film facing away from the substrate.

In some embodiments, the display substrate further includes an electrode film, the electrode film is disposed on a surface of the at least one organic film facing away from the substrate. An orthographic projection of an edge portion of the electrode film on the substrate does not overlap with the orthographic projection of the step-shaped edge portion of the at least one inorganic film on the substrate. Or the display substrate further includes an electrode film, an orthographic projection of an edge portion of the electrode film on the substrate does not overlap with the orthographic projection of the step-shaped edge portion of the at least one inorganic film on the substrate; the at least one metal film includes at least two metal films, and the at least one organic film includes at least two organic films; and the electrode film is disposed on a surface of an outermost organic film facing away from the substrate.

In some embodiments, the electrode film includes an anode of at least one light-emitting device.

In another aspect, a display device is provided. The display apparatus includes the display substrate according to any of the above embodiments.

In yet another aspect, a display substrate motherboard is provided. The display substrate motherboard has a plurality of display regions, a cutting region located between every two adjacent display regions, and a transition region located between each display region and a respective cutting region. The display substrate motherboard includes a substrate motherboard, at least one inorganic layer, at least one metal layer and at least one organic layer. The at least one inorganic layer is disposed on the substrate motherboard; a portion of the entire at least one inorganic layer located in the transition region is step-shaped. The at least one metal layer is disposed on a side of the at least one inorganic layer facing away from the substrate motherboard; a metal layer includes conductive patterns and residual patterns, and an orthographic projection of a residual pattern on the substrate motherboard is located within an orthographic projection of the step-shaped portion of the at least one inorganic film on the substrate motherboard. An organic layer is disposed on a side of the metal layer facing away from the substrate motherboard; an orthographic projection of the organic layer on the substrate motherboard is located outside the cutting region, and a portion of the organic layer located in the transition region covers the residual pattern of the metal layer in the same transition region. A thickness of the step-shaped portion of the at least one inorganic layer decreases in a stepped manner in a direction close to a respective cutting region; a minimum thickness of the step-shaped portion of the at least one inorganic layer is greater than or equal to a thickness of a portion of the at least one inorganic layer located in the cutting region.

In some embodiments, the at least one metal layer includes at least two metal layers, and the at least one organic layer includes at least two organic layers. Each metal layer and a respective organic layer form a film layer pair. In the film layer pair, the organic layer is disposed on a side of the metal layer facing away from the substrate motherboard, and covers the residual patterns of the metal layer. In the at least two metal layers, two adjacent metal layers include a first metal layer and a second metal layer, and the second metal layer is disposed at a side of the first metal layer facing away from the substrate motherboard; in the at least two organic layers, an organic layer between the first metal layer and the second metal layer is a first organic layer. A residual pattern of the second metal layer is disposed on a surface of the first organic layer facing away from the substrate motherboard, and/or disposed on a surface of a portion, not covered by the first organic layer, of the step-shaped portion of the at least one inorganic layer.

In some embodiments, the display substrate motherboard further includes a conductive layer disposed on a side of the at least one organic layer facing away from the substrate motherboard, an orthographic projection of the conductive layer on the substrate motherboard being located in the display regions. Or the display substrate motherboard includes a conductive layer, an orthographic projection of the conductive layer on the substrate motherboard is located in the display regions; the at least one metal layer includes at least two metal layers, and the at least one organic layer includes at least two organic layers, and the conductive layer is disposed on a surface of an outermost organic film facing away from the substrate motherboard.

In yet another aspect, a manufacturing method for a display substrate motherboard is provided, which is used for manufacturing the display substrate motherboard according to any one of the above embodiments. The manufacturing method for the display substrate mother board includes: providing the substrate motherboard; forming the at least one inorganic layer on the side of the substrate motherboard, and the portion of the entire at least one inorganic layer located in the transition region being step-shaped; forming the at least one metal layer on the side of the at least one inorganic layer facing away from the substrate motherboard, and forming the organic layer on a surface of each metal layer facing away from the substrate motherboard, the metal layer including the residual pattern located in the transition region, the orthographic projection of the organic layer on the substrate motherboard being located outside the cutting region, and the portion of the organic layer located in the transition region covering the residual pattern of the metal layer in the same transition region.

In some embodiments, forming the at least one metal layer on the side of the at least one inorganic layer facing away from the substrate motherboard, and forming the organic layer on the surface of each metal layer facing away from the substrate motherboard, includes: forming at least two metal layers and at least two organic layers on the side of the at least one inorganic layer facing away from the substrate motherboard. Each metal layer and a respective organic layer form a layer pair; in the layer pair, the organic layer is disposed on a side of the metal layer facing away from the substrate motherboard, and covers the residual patterns of the metal layer.

In some embodiments, the method for manufacturing the display substrate motherboard further includes: forming a conductive layer on a side of the at least one organic layer facing away from the substrate motherboard; an orthographic projection of the conductive layer on the substrate motherboard being located in the display regions. Or the manufacturing method further includes: forming a conductive layer on a side of the at least one organic layer facing away from the substrate motherboard, an orthographic projection of the conductive layer on the substrate motherboard being located in the display regions. The at least one metal layer includes at least two metal layers, and the at least one organic layer includes at least two organic layers. Forming the conductive layer on the side of the at least one organic layer facing away from the substrate motherboard, includes: forming the conductive layer on a surface of an outermost organic layer facing away from the substrate motherboard.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these accompanying drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Technical solutions in some embodiments of the present disclosure will be described clearly and completely below with reference to the accompanying drawings. However, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" and "some examples" are intended to indicate that specific features, structures or characteristics related to the embodiment(s) or example(s) are included in at least one embodiment or example of the present disclosure. Schematic representation of the above term does not necessarily refer to the same embodiment(s) or examples(s). In addition, the specific features, structures, materials, or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, terms such as "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" used herein has an open and inclusive meaning, which does not exclude devices that are applicable to or configured to perform additional tasks or steps.

In addition, the phrase "based on" used herein is meant to be open and inclusive, since a process, step, calculation, or other action that is "based on" one or more of the stated conditions or values may, in practice, be based on additional conditions or values other than those stated.

As used herein, terms such as "about", "substantially" or "approximately" include a stated value and an average value within an acceptable range of deviation of a particular value. The acceptable range of deviation is determined by a person of ordinary skill in the art in view of the measurement in question and errors associated with the measurement of a particular quantity (i.e., limitations of the measurement system).

Exemplary embodiments are described herein with reference to sectional views and/or plan views as idealized exemplary drawings. In the accompanying drawings, thicknesses of layers and sizes of regions are enlarged for clarity. Thus, variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

In the related art, display substrate motherboards are mostly cut by a laser cutting process.

At present, in a flexible display substrate motherboard, a substrate motherboard is a flexible substrate motherboard, and the flexible substrate motherboard is composed of organic layer(s), such as polyimide layer(s). During a manufacturing process of the flexible display substrate motherboard, a portion of at least one inorganic layer with a thin thickness is formed on a portion of the flexible substrate motherboard that is located in a cutting region, which may protect the flexible substrate motherboard, so as to prevent the flexible substrate motherboard from being damaged (e.g., burned) by laser light in a process of cutting the flexible display substrate motherboard.

However, the portion of the inorganic layer(s) located in the cutting region is obtained by an inorganic film thinning process. That is, at least one inorganic layer is first manufactured on a side of the flexible substrate motherboard, and then the portion of the at least one inorganic layer located in the cutting region is thinned. Therefore, a portion of the inorganic layer(s) that is located in a transition region between the cutting region and a display region is generally step-shaped.

Based on this, in a process of manufacturing conductive patterns (e.g., sources and drains) on the inorganic layer(s) using a metal material, it is easy to cause metal residues on the step-shaped portion of the inorganic layer(s). That is, on the portion where there should be no need to provide a conductive pattern, metal (i.e., a metal residual pattern) that is not removed by etching is left. In this way, in a subsequent process of manufacturing other conductive structures (e.g., anodes), these other conductive structures are likely to be short-circuited with the metal residual pattern through contacting; or in a wet etching process for forming these other conductive structures, metal substitution is easily occurred between metal ions in etching liquid and the metal residual pattern, so that the substituted metal simple substance may cause a short circuit of respective conductive patterns in the display region or dark spots in the display region after moving to the display region with the etching liquid. As a result, display substrates, obtained by cutting the display substrate motherboard, have a poor display.

Referring to FIGS. 1 to 6, some embodiments of the present disclosure provide a display substrate 100. The display substrate 100 includes a substrate 101, at least one inorganic film 120, metal film(s) 130 and organic film(s) 140. The at least one inorganic film 120 is disposed on the substrate 101. The metal film(s) 130 are disposed on a side of the at least one inorganic film 120 facing away from the substrate 101. An organic film 140 is disposed on a side of a metal film 130 facing away from the substrate 101. At least one edge portion 121 of the entire at least one inorganic film 120 is step-shaped. The metal film 130 includes a conductive pattern 131 and residual pattern(s) 132. An orthographic projection of a residual pattern 132 on the substrate 101 is located within an orthographic projection of a step-shaped edge portion 121 of the at least one inorganic film 120 on the substrate 101. An edge portion of the organic film 140 covers the residual pattern 132 of the metal film 130.

Figure 2:
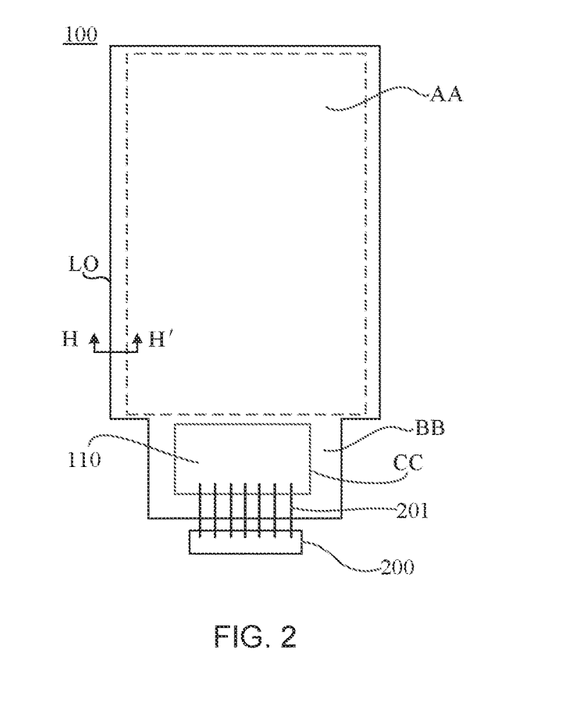
FIG. 2 is a diagram showing a structure of a display substrate, in accordance with some embodiments.

Referring to FIG. 2, the display substrate 100 has a display region AA and a peripheral region BB located on at least one side of the display region AA. The edge portion 121 of the at least one inorganic film 120 refers to a portion of the at least one inorganic film 120 located in the peripheral region BB. Similarly, an edge portion of any film layer is a portion of the film layer located in the peripheral region BB herein.

Figure 1:
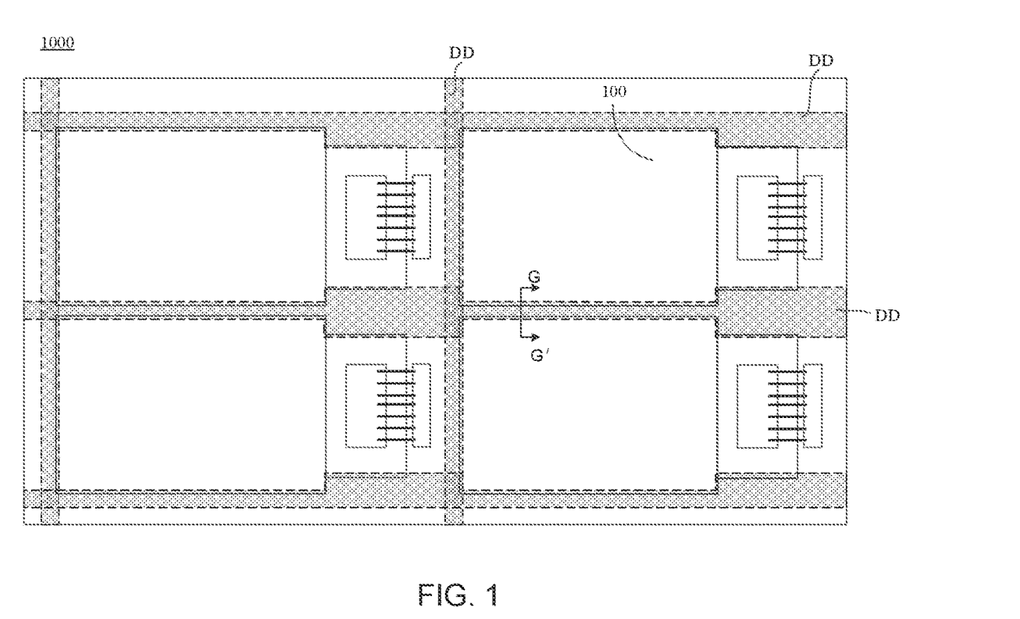
FIG. 1 is a diagram showing a structure of a display substrate motherboard, in accordance with some embodiments.

Here, the peripheral region BB of the display substrate 100 includes a bonding region CC. The display substrate 100 further includes a driving circuit 110 disposed in the bonding region CC. It will be understood that, as shown in FIGS. 1 and 2, after thin film structures in the display substrate 100 are manufactured, an array test (AT) unit 200 connected to the driving circuit 110 through test connection lines 201 is manufactured. The array test unit 200 may be used to check the driving circuit 110 in the display substrate 100, so as to determine whether circuits (including the driving circuit 110 and pixel circuits in the display region AA) in the display substrate 100 are short-circuited or open-circuited. The array test unit 200 will be cut off in a subsequent process.

Here, for example, the substrate 101 is a flexible substrate, which is made of a polyimide material. Of course, a material for manufacturing the substrate 101 is not limited to this, and other flexible materials capable of manufacturing a light-transmissive substrate are also suitable.

Here, the number of layers of the inorganic films 120 may be one or more. In a case where the number of layers of the inorganic films is multiple, the multiple inorganic films 120 are stacked in sequence, or every two inorganic films are provided with other functional film(s) (e.g., a metal film or an organic film) therebetween. In addition, the inorganic film is made of the inorganic compound. For example, the inorganic film is made of at least one of silicon nitride, silicon oxide and silicon oxynitride.

Here, the conductive pattern 131 in each metal film 130 refers to effective conductive portions of the metal film 130 for forming electrodes and/or signal lines in the display substrate 100. The residual pattern 132 in each metal film 130 refers to a portion of the display substrate 100 that should not need to be provided, but cannot be effectively removed due to a film layer structure in the display substrate 100 or a manufacturing process of the film layer structure.

Here, the residual pattern 132 is wrapped by the organic film 140 and the substrate 101. That is, the edge portion of the organic film 140 may completely shield the residual pattern 132 of the respective metal film 130 to ensure that the residual pattern 132 is not exposed. In addition, the organic film 140 is disposed on the side of the metal film 130 facing away from the substrate 101, which may be the organic film 140 being directly formed on a surface of the respective metal film 130 facing away from the substrate 101, or the organic film 140 and the respective metal film 130 being provided with other film(s) (e.g., a passivation film) therebetween.

In the embodiments of the present disclosure, the residual pattern 132 of the metal film 130 is formed due to a step-shaped structure of the edge portion 121 of the at least one inorganic film 120. In the embodiments of the present disclosure, the organic film 140 is manufactured on the side of each metal film 130 facing away from the substrate 101, and the edge portion of the organic film 140 may effectively cover the residual pattern 132 of the respective metal film 130. In this way, the residual pattern 132 may be shielded and protected by using the organic film 140.

Therefore, in a process of manufacturing a subsequent metal film 130 or other conductive structures, by using the organic film 140 covering and shielding the respective residual pattern 132 of a previous metal film 130, it may be possible to effectively prevent etching liquid required by wet etching for forming the subsequent metal film 130 or the other conductive structures from contacting the residual pattern 132 of the previous metal film 130, and thus avoid a short circuit of the subsequent metal film 130 or the other conductive structures due to the residual pattern 132, or avoid display dark spots in the display region AA due to the metal substitution between metal ions in the etching liquid and the residual pattern 132. In this way, poor display caused by metal residues in an edge portion of the display substrate 100 is effectively ameliorated, which is beneficial to improve production yield of the display substrate 100.

Figure 3:
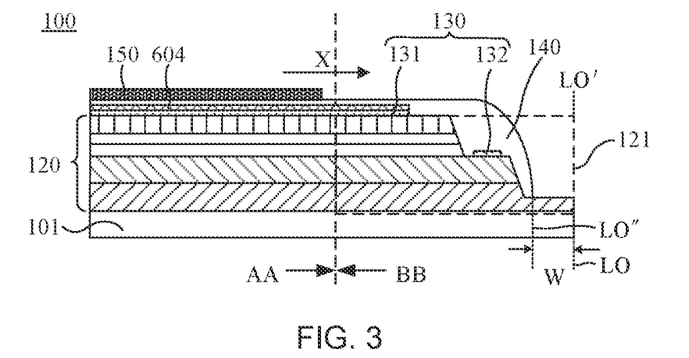
FIG. 3 is a partial sectional view of the display substrate shown in FIG. 2 taken along the HH' direction.
Figure 4:
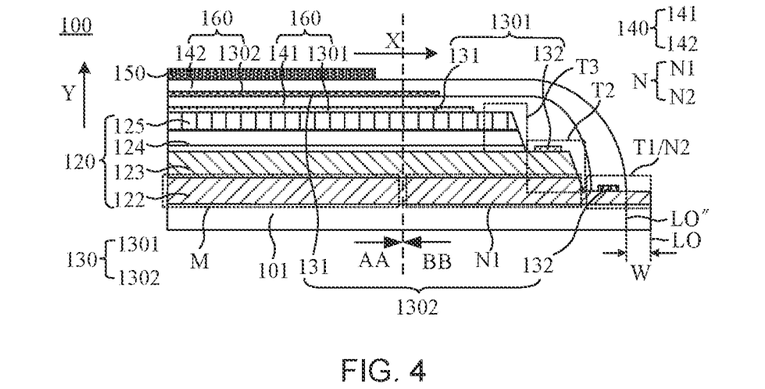
FIG. 4 is another partial sectional view of the display substrate shown in FIG. 2 taken along the HH' direction.

Referring to FIGS. 3 and 4, in some embodiments, in a direction X parallel to the substrate 101 and pointing from a center of the at least one inorganic film 120 to a boundary of the step-shaped edge portion 121 of the at least one inorganic film 120, a thickness of the step-shaped edge portion 121 of the at least one inorganic film 120 decreases in a stepped manner, so that the edge portion 121 has the stepped shape.

The display substrate 100 is obtained after a display substrate motherboard is cut by using the laser light. That is, boundaries of the display substrate 100 are formed through cutting in a cutting process. Therefore, the closer a portion of the step-shaped edge portion 121 of the at least one inorganic film 120 in the display substrate 100 is to a cutting surface of the display substrate 100, the smaller the thickness of the portion is.

In addition, as shown in FIG. 3, an orthographic projection of the boundary LO' of the step-shaped edge portion 121 of the at least one inorganic film 120 on the substrate 101 approximately coincides with a boundary LO of a respective side of the substrate 101. In this way, in a process of cutting the display substrate motherboard by the laser light to obtain the display substrate 100, the substrate 101 of the display substrate 100 may be effectively protected by the inorganic film(s) 120 with a relatively small thickness, so that the substrate 101 may be prevented from being damaged by the laser light.

In some embodiments, as shown in FIGS. 3 and 4, a space W exists between an orthographic projection, on the substrate 101, of a boundary LO" of the edge portion of the organic film 140 covering the residual pattern 132 and the boundary LO of the respective side of the substrate 101. That is to say, the organic film 140 is not located at the cutting surface of the display substrate 100. In this way, it is possible to effectively prevent the organic film 140 from being burned due to laser energy in the process of cutting the display substrate motherboard by the laser light to obtain the display substrate 100.

In some embodiments, as shown in FIGS. 3 to 6, the display substrate 100 further includes an electrode film 150 disposed on a side of the organic film(s) 140 facing away from the substrate 101. An orthographic projection of an edge portion of the electrode film 150 on the substrate 101 does not overlap with the orthographic projection of the step-shaped edge portion of the at least one inorganic film 120 on the substrate 101. That is, a boundary of the edge portion of the electrode film 150 is indented toward a middle of the substrate 101 relative to the boundary of the edge portion 121 of the at least one inorganic film 120.

In some embodiments, the electrode film 150 includes an anode of at least one light-emitting device. The electrode film 150 may be an opaque electrode film 150, such as a stacked structure of silver-indium tin oxide-silver (Ag-ITO-Ag).

Here, the electrode film 150 is made of a metal material or a conductive material including the metal material, and may be formed by a wet etching process. In a process of manufacturing the electrode film 150, in a case where metal in materials for manufacturing the electrode film 150 is dissolved in etching liquid and exists in a form of metal ions, under a protection of the organic film 140 covering the residual pattern(s) 132 of the respective metal film 130, the metal ions will not undergo metal substitution with the residual pattern(s) 132. In this way, it is possible to avoid that substituted metal simple substance moves into the display region AA of the display substrate 100 with the flow of the etching liquid, thereby avoiding display dark spots.

Figure 6:
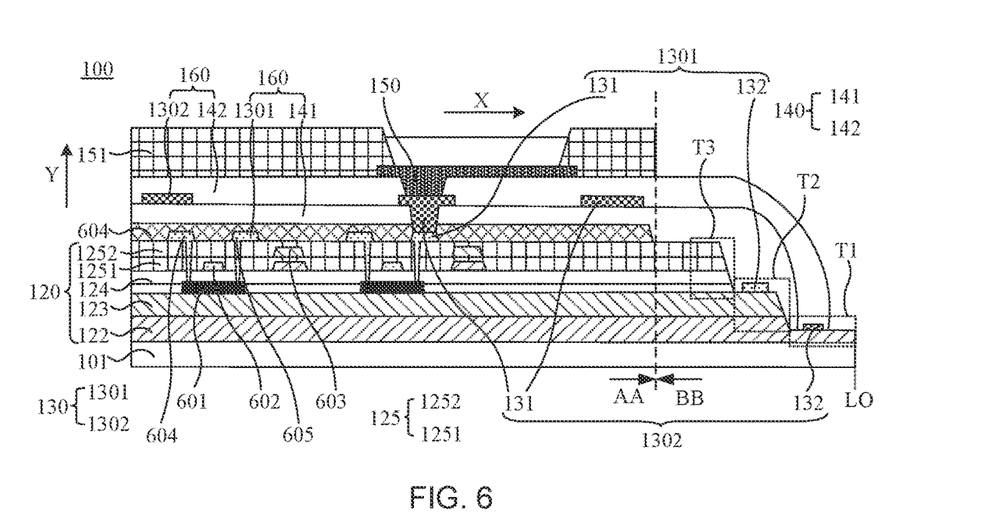
FIG. 6 is yet another partial sectional view of the display substrate shown in FIG. 2 taken along the HH' direction.

In some embodiments, referring to FIGS. 3 and 6, the display substrate 100 further includes a passivation film 604, the passivation film 604 is disposed on a side of a conductive pattern 131 of a metal film 130 facing away from the substrate 101, and a respective organic film 140 is located on a side of the passivation film 604 facing away from the substrate 101.

Here, the passivation film 604 is generally made of an inorganic material such as silicon nitride, silicon oxide, or silicon oxynitride. The passivation film 604 may be formed only in the display region AA, or may extend to the peripheral region BB from the display region AA.

Figure 5:
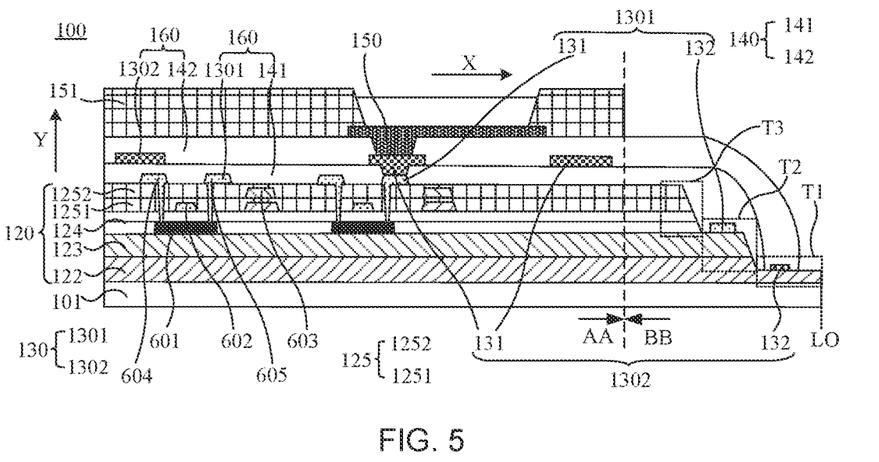
FIG. 5 is yet another partial sectional view of the display substrate shown in FIG. 2 taken along the HH' direction.

In some embodiments, referring to FIGS. 4 to 6, the display substrate 100 includes at least two metal films 130 and at least two organic films 140. Each metal film 130 and a respective organic film 140 form a film pair 160. In the same film pair 160, the organic film 140 is disposed on a side of the metal film 130 facing away from the substrate 101 and covers residual pattern(s) of the metal film 130.

Referring to FIGS. 4 to 6, in the at least two metal films 130, two adjacent metal films 130 are a first metal film 1301 and a second metal film 1302, and the second metal film 1302 is disposed at a side of the first metal film 1301 facing away from the substrate 101. In the at least two organic films 140, an organic film 140 between the first metal film 1301 and the second metal film 1302 is a first organic film 141, and the first metal film 1301 and the first organic film 141 form a film pair 160; an organic film 140 on a side of the second metal film 1302 facing away from the substrate 101 is a second organic film 142, and the second metal film 1302 and the second organic film 142 form another film pair 160.

Figure 12:
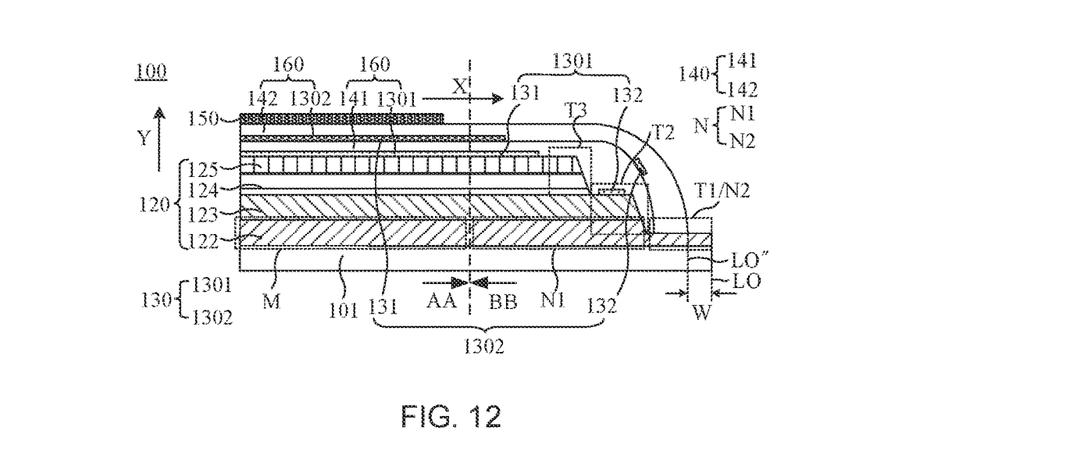
FIG. 12 is yet another partial sectional view of the display substrate shown in FIG. 2 taken along the HH' direction.
Figure 13:
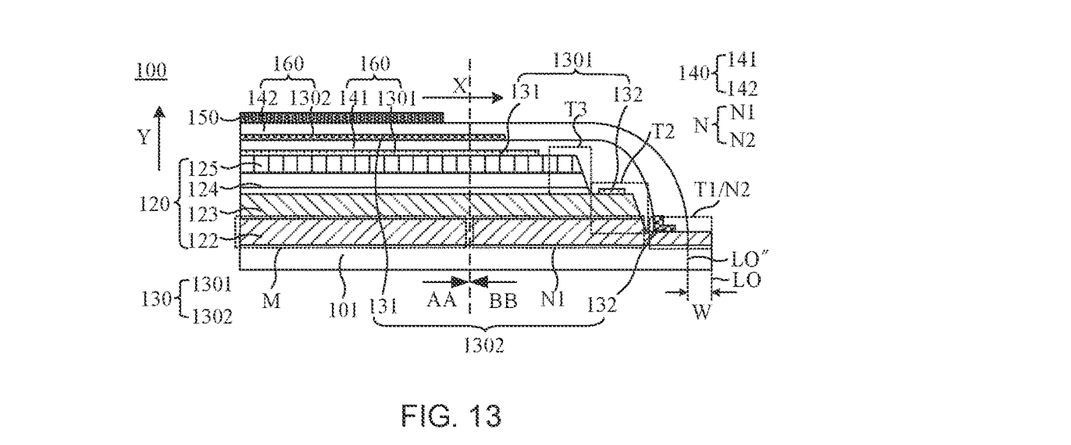
FIG. 13 is yet another partial sectional view of the display substrate shown in FIG. 2 taken along the HH' direction.

Here, as shown in FIG. 12, the residual pattern 132 of the second metal film 1302 is formed on a surface of the first organic film 141 facing away from the substrate 101, e.g., a slope surface of the first organic film 141 in FIG. 12. Alternatively, as shown in FIGS. 4 to 6, the residual pattern 132 of the second metal film 1302 is formed on a surface of a portion, which is not covered by the first organic film 141, of the step-shaped edge portion 121 of the at least one inorganic film 120. Alternatively, as shown in FIG. 13, the residual pattern 132 of the second metal film 1302 is formed on the surface of the portion, which is not covered by the first organic film 141, of the step-shaped edge portion 121 of the at least one inorganic film 120, and on the surface of the first organic film 141 facing away from the substrate 101. All of the above situations are allowed, which will not be limited in the embodiments.

Here, as shown in FIG. 4, in the case where the display substrate 100 includes the at least two metal films 130 and the at least two organic films 140, the electrode film 150 is disposed on a surface of an outermost organic film 140 facing away from the substrate 101.

Here, as shown in FIG. 6, in the case where the display substrate 100 includes the at least two metal films 130 and the at least two organic films 140, the passivation film 604 is disposed on a side of a conductive pattern 131 of an innermost metal film 130 facing away from the substrate 101, and an innermost organic film 140 is located on the side of the passivation film 604 facing away from the substrate 101.

In some embodiments, the first metal layer and the second metal layer may be made of a same material. The first metal film 1301 and the second metal film 1302 may be of a single-layer structure or a multi-layer structure. For example, the first metal film 1301 and the second metal film 1302 each are a stacked structure of titanium-aluminum-titanium (Ti—Al—Ti).

In some other embodiments, the first metal film 1301 and the second metal film 1302 are made of different metal materials.

In a process of manufacturing the second metal film 1302, even if metal in materials for manufacturing the second metal film 1302 is dissolved in etching liquid and exists in the form of metal ions, under the protection of the first organic film 141 covering the residual pattern 132 of the first metal film 1301, the metal ions will not undergo metal substitution with the residual pattern 132.

In addition, it may be understood that the conductive pattern 131 of the first metal film 1301, the conductive pattern 131 of the second metal film 1302 and the electrode film 150 in the display substrate 100 may each include electrodes and/or signal lines located in a same film layer of the display substrate 100. It is related to a structure of the display substrate 100, which will not be limited in the embodiments of the present disclosure.

For example, as shown in FIGS. 5 and 6, the conductive pattern 131 of the first metal film 1301 includes at least one conductive electrode and at least one signal line. The at least one conductive electrode includes at least one of a source 604 and a drain 605 of a thin film transistor in a pixel circuit. The at least one signal line includes at least one of a data signal line, a voltage signal line, a clock signal line, and a sensing signal line. The data signal line is configured to transmit a data signal (Data signal) required by the pixel circuit, the voltage signal line is configured to transmit a power voltage signal (e.g., VDD signal or VSS signal) required by the pixel circuit, the clock signal line is configured to transmit a clock signal (CLK signal) required by a gate drive circuit, and the sensing signal line is configured to transmit a sensing signal (Sense signal) required by the pixel circuit.

For example, the conductive pattern 131 of the second metal film 1302 includes at least one of at least one connection electrode, at least one initialization signal line, and at least one signal line auxiliary line. Here, a connection electrode may electrically connect a conductive electrode to the electrode film 150, so that in a case where the conductive electrode serves as the source or the drain of the thin film transistor, and the electrode film 150 includes the anode of the light-emitting device, the connection electrode may realize an electrical connection between the thin film transistor and the light-emitting device. The initialization signal line is configured to transmit an initialization signal (Vintial signal) required by the pixel circuit. The signal line auxiliary line may be electrically connected to some signal lines in the first metal film 1301 to assist in transmitting a corresponding signal.

In some embodiments, referring to FIGS. 4 to 6, in a thickness direction Y of the substrate 101 and away from the substrate 101, the step-shaped edge portion 121 of the at least one inorganic film 120 includes a first step T1, a second step T2 and a third step T3. An outer boundary of the second step T2 is indented toward the middle of the substrate 101 relative to an outer boundary of the first step T1, and an outer boundary of the third step T3 is indented toward the middle of the substrate 101 relative to the outer boundary of the second step T2.

Here, only a portion of the second step T2 and a portion of the third step T3 are respectively denoted as the second step T2 and the third step T3 in FIGS. 4 and 5. In addition, dimensions (e.g., height, length, and width) of the first step T1, the second step T2 and the third step T3 may be selectively set according to actual needs, which are not limited in the embodiments of the present disclosure. The step-shaped structure of the edge portion 121 of the at least one inorganic film 120 is related to the number of layers and thickness of the inorganic film(s) 120, which may be selectively set according to actual needs.

Based on this, for example, as shown in FIGS. 4 to 6, the residual pattern 132 of the first metal film 1301 is formed on the second step T2, and an edge portion of the first organic film 141 extends onto the first step T1. The residual pattern 132 of the second metal film 1302 is formed on the first step T1, an edge portion of the second organic film 142 at least partially covers the first step T1.

In some embodiments, with continued reference to FIGS. 4 to 6, the at least one inorganic film 120 includes at least one of a barrier film 122, a buffer film 123, a gate insulating film 124 and an interlayer insulating film 125. Here, the at least one inorganic film 120 existing in the display substrate 100 may be used as inorganic film(s) for protecting a substrate motherboard in the display substrate motherboard 1000. As a result, there is no need to provide other inorganic films for the substrate motherboard in the display substrate motherboard 1000, which simplifies a manufacturing process.

For example, with continued reference to FIG. 4, the at least one inorganic film 120 includes: the barrier film 122, the buffer film 123, the gate insulating film 124 and the interlayer insulating film 125 that are stacked in sequence. The barrier film 122 includes a main body portion M and edge portion(s) N. An edge portion N of the barrier film 122 includes a connection portion N1 connected to the main body portion M of the barrier film 122, and a recess portion N2 located on a side of the connection portion N1 away from the main body portion M of the barrier film 122, a thickness of the connection portion N1 is greater than that of the recess portion N2. The recess portion N2 forms the first step T1.

A boundary of an orthographic projection of the buffer film 123 on the barrier film 122 approximately coincides with a boundary of the connection portion N1 of the barrier film 122. An edge portion of the buffer film 123 close to the recess portion N2 and the connection portion N1 together form the second step T2 (only a portion of the second step T2 is denoted as the second step T2 in FIG. 4).

A boundary of an orthographic projection of the gate insulating film 124 on the buffer film 123 and a respective boundary of an orthographic projection of the interlayer insulating film 125 on the buffer film 123 are located on a side of a boundary of the buffer film 123 proximate to the middle of the buffer film. An edge portion of the gate insulating film 124 and an edge portion of the interlayer insulating film 125 that are close to the recess portion N2 together form the third step T3 (only a portion of third step T3 is denoted as the third step T3 in FIG. 4).

Here, the main portion M of the barrier film 122 refers to a portion of the barrier film 122 located in the display region AA, and the edge portion N of the barrier film 122 refers to a portion of the barrier film 122 located in the peripheral region BB. Similarly, the edge portion of the buffer film 123 refers to a portion of the buffer film 123 located in the peripheral region BB, the edge portion of the gate insulating film 124 refers to a portion of the gate insulating film 124 located in the peripheral region BB, and the edge portion of the interlayer insulating film 125 refers to a portion of the interlayer insulating film 125 located in the peripheral region BB.

Based on this, as shown in FIGS. 5 and 6, the interlayer insulating film 125 includes a first interlayer insulating sub-film 1251 and a second interlayer insulating sub-film 1252. The second interlayer insulating sub-film 1252 is disposed on a side of the first interlayer insulating sub-film 1251 facing away from the substrate 101.

The display substrate 100 further includes semiconductor pattern(s) 601, first gate pattern(s) 602 and second gate pattern(s) 603. The semiconductor pattern 601 is formed on a surface of the buffer film 123 facing away from the substrate 101. The first gate pattern 602 is formed on a surface of the gate insulating film 124 facing away from the substrate 101, and the first interlayer insulating sub-film 1251 covers the first gate pattern 602. The second gate pattern 603 is formed on a surface of the first interlayer insulating sub-film 1251 away from the substrate 101, and the second interlayer insulating sub-film 1252 covers the second gate pattern 603.

The conductive pattern 131 of the first metal film 1301 is located on a surface of the second interlayer insulating sub-film 1252 away from the substrate 101, and a conductive electrode of the conductive pattern 131 of the first metal film 1301 is connected to the semiconductor pattern 601. In this way, the first gate pattern 602, the conductive electrode and the semiconductor pattern 601 form the thin film transistor, the first gate pattern 602 is a gate of the thin film transistor, the conductive electrode is the source or the drain of the thin film transistor, and the semiconductor pattern 601 is an active layer of the thin film transistor.

The display substrate 100 further includes capacitor electrode(s) disposed on a same layer as the first gate pattern 602. An orthographic projection of a capacitor electrode on the substrate 101 at least partially overlaps with the orthographic projection of the second gate pattern 603 on the substrate 101, so that the capacitor electrode and the second gate pattern 603 form a storage capacitor of the pixel circuit.

Here, the edge portion of the gate insulating film 124, an edge portion of the first interlayer insulating sub-film 1251, and an edge portion of the second interlayer insulating sub-film 1252 form the third step T3. In addition, in a case where the display substrate 100 further includes the passivation film 604 and the passivation film 604 extends to the peripheral region BB from the display region AA, an edge portion of the passivation film 604 and the edge portions of the second interlayer insulating sub-film 1252, the first interlayer insulating sub-film 1251 and the gate insulating film 124 together form the third step T3.

The above embodiments only schematically describe several corresponding solutions for a top-gate thin film transistor, but the protection scope of the embodiments of the present disclosure is not limited thereto. For example, for a bottom-gate thin film transistor, a relationship of film layers in the display substrate 100 may be changed or exchanged correspondingly, which will not be described in the embodiments of the present disclosure.

Figure 11:
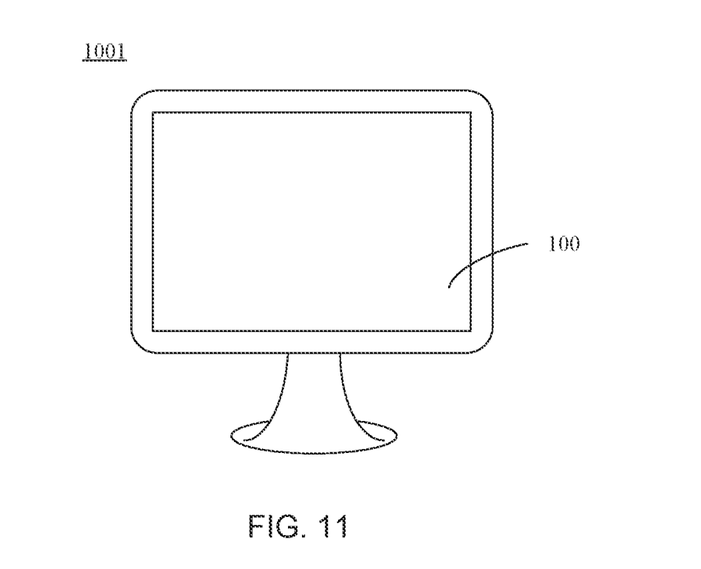
FIG. 11 is a diagram showing a structure of a display apparatus, in accordance with some embodiments.

Based on the above embodiments of the display substrate 100, as shown in FIG. 11, some embodiments of the present disclosure provide a display device 1001. The display device 1001 includes the display substrate 100 provided in the above embodiments.

In some embodiments, the display device 1001 is a product or a component with a display function such as an organic light-emitting diode (OLED) display panel, an OLED display, an OLED television, a mobile phone, a tablet computer, a notebook computer, an electronic paper, a digital photo frame or a navigator.

Beneficial effects that may be achieved by the display device 1001 provided in the embodiments of the present disclosure are the same as the beneficial effects that may be achieved by the display substrate 100 provided in the above embodiments, and details will not be repeated here.

Figure 7:
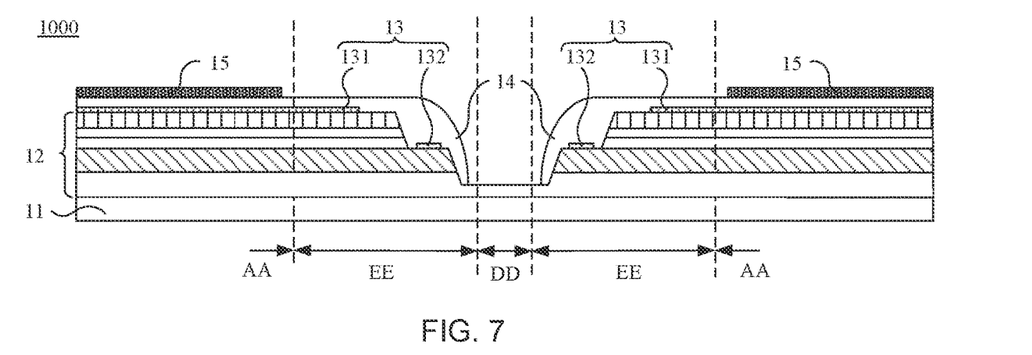
FIG. 7 is a partial sectional view of the display substrate motherboard shown in FIG. 1 taken along the GG' direction.
Figure 8:
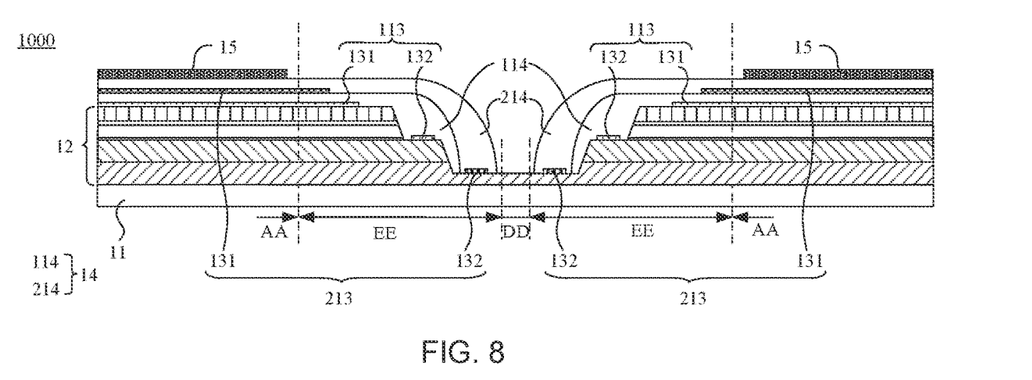
FIG. 8 is another partial sectional view of the display substrate motherboard shown in FIG. 1 taken along the GG' direction.

Based on the embodiments of the display substrate 100, as shown in FIGS. 1, 7 and 8, some embodiments of the present disclosure provide a display substrate motherboard 1000. The display substrate motherboard 1000 in the embodiments of the present disclosure is used to obtain the display substrate 100 as described in the above embodiments after being cut. Beneficial effects achieved by the display substrate motherboard 1000 are the same as the beneficial effects achieved by the display substrate 100 provided in the above embodiments, and details will not be repeated here.

Referring to FIGS. 1, 7 and 8, the display substrate motherboard 1000 has a plurality of display regions AA, a cutting region DD located between every two adjacent display regions AA, and a transition region EE located between each display region AA and a respective cutting region DD. The transition region EE is the peripheral region BB of the display substrate 100. The plurality of display regions AA are arranged in an array, a portion corresponding to each display region AA and transition region(s) EE adjacent to the display region AA may be cut into the display substrate 100. The display substrate motherboard 1000 is cut by the laser light in the cutting region DD.

With continued reference to FIGS. 1, 7 and 8, the display substrate motherboard 1000 includes a substrate motherboard 11, at least one inorganic layer 12, metal layer(s) 13 and organic layer(s) 14. The at least one inorganic layer 12 is disposed on the substrate motherboard 11, and a portion of the entire at least one inorganic layer 12 located in the transition region EE is step-shaped. The metal layer(s) 13 are disposed on a side of the at least one inorganic layer 12 facing away from the substrate motherboard 11. A metal layer 13 includes conductive patterns 131 and residual patterns 132, and an orthographic projection of a residual pattern 132 on the substrate motherboard 11 is located within an orthographic projection of the step-shaped portion of the at least one inorganic layer on the substrate motherboard 11. An organic layer 14 is disposed on a side of the metal layer 13 facing away from the substrate motherboard 11, an orthographic projection of the organic layer 14 on the substrate motherboard 11 is located outside the cutting region DD, and a portion of the organic layer 14 located in the transition region EE covers the residual pattern 132 of the metal layer 13 in the same transition region EE.

In addition, in some embodiments, as shown in FIG. 7, a thickness of the step-shaped portion of the at least one inorganic layer 12 decreases in a stepped manner in a direction close to a respective cutting region DD. A minimum thickness of the step-shaped portion of the at least one inorganic layer 12 is greater than or equal to a thickness of a portion of the at least one inorganic layer 12 located in the cutting region DD. That is, the thickness of the portion of the at least one inorganic layer 12 located in the cutting region DD is the smallest. In this way, cutting of the laser light in the cutting region DD will not be affected by the thickness of the portion of the at least one inorganic layer 12 located in the cutting region DD; and moreover, the at least one inorganic layer 12 is used to protect the substrate motherboard 11 when the substrate motherboard 11 is cut, which may effectively prevent the substrate motherboard 11 from being burned by the laser light.

In some embodiments, as shown in FIG. 7, the display substrate motherboard 1000 further includes a conductive layer 15 disposed on a side of the organic layer(s) 14 facing away from the substrate motherboard 11. An orthographic projection of the conductive layer 15 on the substrate motherboard 11 is located in the display regions AA.

Here, the conductive layer 15 is made of a metal material or a conductive material including the metal material, and may be formed by a wet etching process. In a process of manufacturing the conductive layer 15, even if metal in materials for manufacturing the conductive layer 15 is dissolved in etching liquid and exists in the form of metal ions, under a protection of the organic layer 14 covering the residual pattern 132 of the respective metal layer 13, the metal ions will not undergo metal substitution with the residual pattern 132. Therefore, it is possible to avoid that substituted metal simple substance moves into the display regions AA with the flow of the etching liquid, thereby avoiding display dark spots.

It will be understood that, the display substrate 100 described in some of the above embodiments is obtained by cutting the display substrate motherboard 1000 by the laser light. That is, the substrate 101 in the display substrate 100 is obtained by cutting the substrate motherboard 11. The at least one inorganic film 120 of the display substrate 100 is obtained by cutting the at least one inorganic layer 12 of the display substrate motherboard 1000. The metal film(s) 130 of the display substrate 100 is obtained by cutting the metal layer(s) 13 of the display substrate motherboard 1000. The organic film(s) 140 of the display substrate 100 is obtained by cutting the organic layer(s) 14 of the display substrate motherboard 1000. The electrode film 150 of the display substrate 100 is obtained by cutting the conductive layer 15 of the display substrate motherboard 1000. Therefore, manufacturing materials and corresponding structures of the substrate motherboard 11, the at least one inorganic layer 12, the metal layer(s) 13, the organic layer(s) 14 and the conductive layer 15 may refer to relevant descriptions in the above embodiments, which will not be repeated here.

In some embodiments, as shown in FIG. 8, the display substrate motherboard 1000 includes at least two metal layers 13 and at least two organic layers 14, each metal layer 13 and a respective organic layer 14 form a layer pair. In the layer pair, the organic layer 14 is disposed on a side of the metal layer 13 facing away from the substrate motherboard 11, and covers the residual patterns 132 of the metal layer 13. In the at least two metal layers 13, two adjacent metal layers 13 include a first metal layer 113 and a second metal layer 213, and the second metal layer 213 is disposed at a side of the first metal layer 113 facing away from the substrate motherboard 11. In the at least two organic layers, an organic layer 14 between the first metal layer 113 and the second metal layer 213 is a first organic layer 114, and another organic layer 14 located on a side of the second metal layer 213 facing away from the substrate motherboard 11 is a second organic layer 214.

Figure 14:
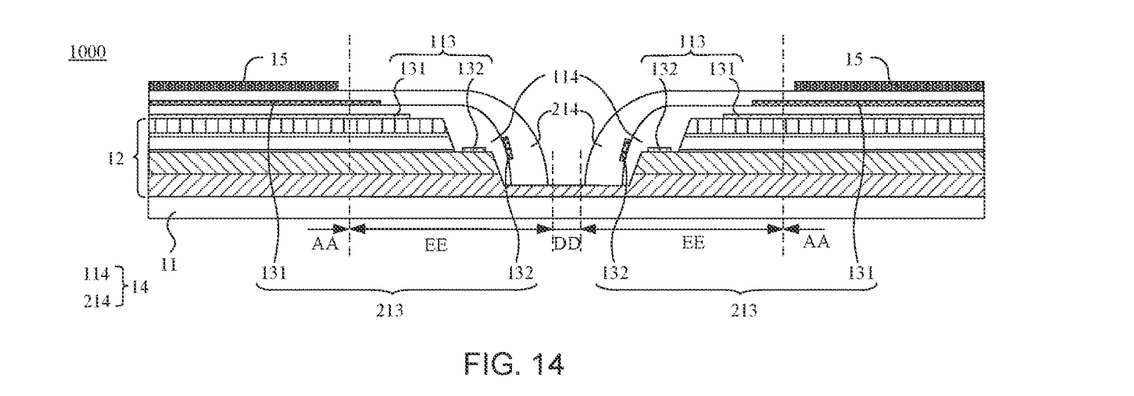
FIG. 14 is yet another partial sectional view of the display substrate motherboard shown in FIG. 1 taken along the GG' direction.
Figure 15:
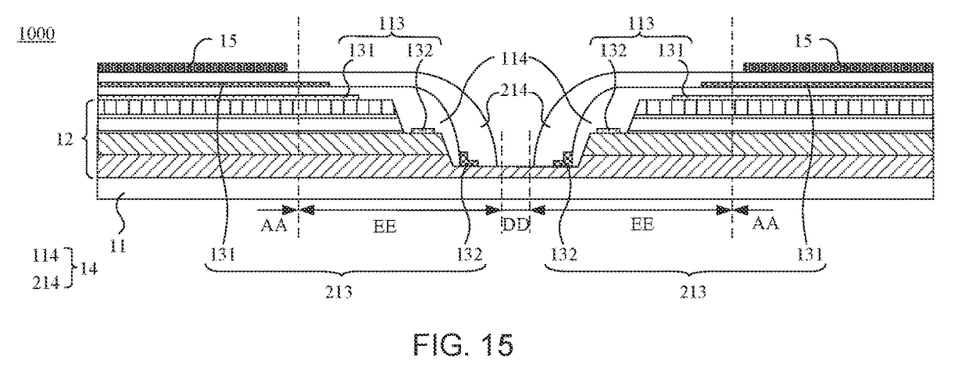
FIG. 15 is yet another partial sectional view of the display substrate motherboard shown in FIG. 1 taken along the GG' direction.

Here, referring to FIGS. 8,14 and 15, the residual pattern 132 of the second metal layer 213 is formed on a surface of the first organic layer 114 facing away from the substrate motherboard 11, and/or formed on a surface of a portion, which is not covered by the first organic layer 141, of the step-shaped portion of the at least one inorganic layer 12.

In some embodiments, the first metal layer 113 and the second metal layer 213 may be made of a same material. For example, the first metal layer 113 and the second metal layer 213 each are of a multi-layer structure, such as a stacked structure of titanium-aluminum-titanium (Ti—Al—Ti).

In some other embodiments, the first metal layer 113 and the second metal layer 213 are made of different metal materials.

In a process of manufacturing the second metal layer 213, even if metal in materials for manufacturing the second metal layer 213 is dissolved in etching liquid and exists in the form of metal ions, under the protection of the first organic layer 114 covering the residual pattern 132 of the first metal layer 113, the metal ions will not undergo metal substitution with the residual pattern 132.

Based on the embodiments of the display substrate motherboard 1000 described above, as shown in FIG. 10, some embodiments of the present disclosure provides a manufacturing method for a display substrate motherboard 1000. The manufacturing method for the display substrate motherboard 1000 is used to manufacture the display substrate motherboard 1000 in the embodiments described above. Beneficial effects achieved by the manufacturing method for the display substrate motherboard 1000 provided in some embodiments of the present disclosure are the same as beneficial effects achieved by the display substrate motherboard 1000 provided in the above embodiments, which will not be repeated here.

Figure 10:
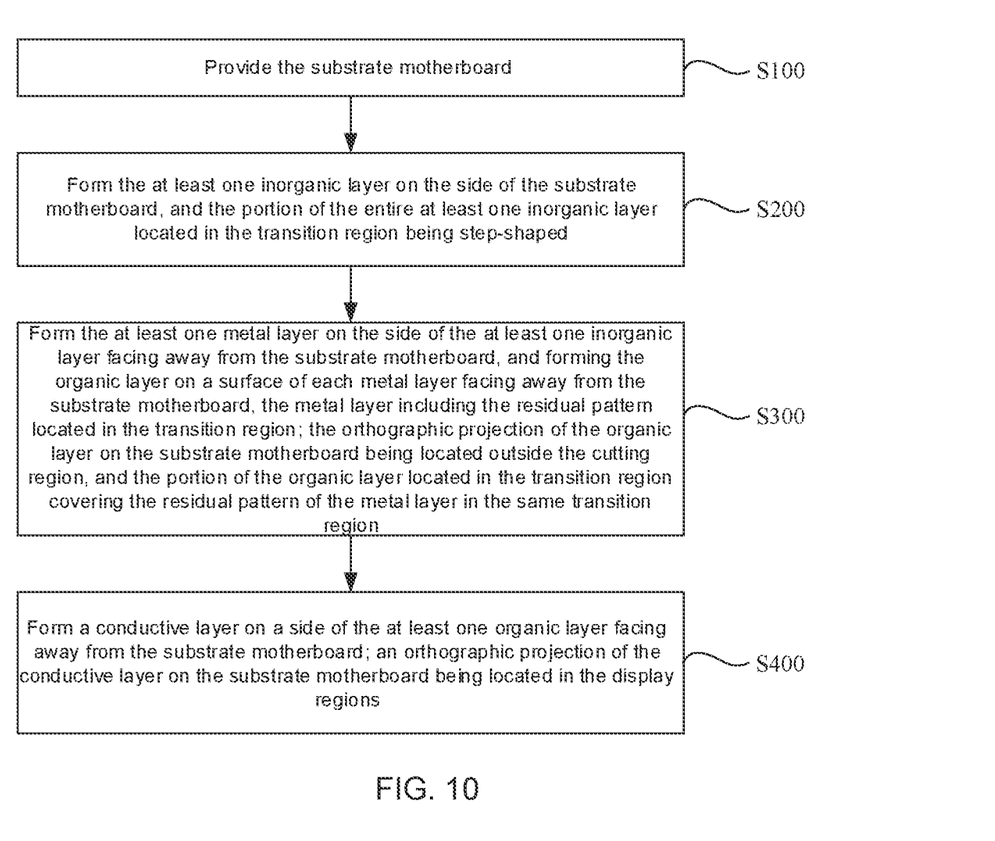
FIG. 10 is a flowchart of a method for manufacturing a display substrate, in accordance with some embodiments.

Referring to FIGS. 7 and 10, the manufacturing method for the display substrate motherboard 1000 includes steps 100 to 400 (S100 to S400).

In S100, the substrate motherboard 11 is provided.

In S200, the at least one inorganic layer 12 is formed on the side of the substrate motherboard 11, and the portion of the entire at least one inorganic layer 12 located in the transition region EE is step-shaped.

In S300, the metal layer(s) 13 are formed on the side of the at least one inorganic layer 12 facing away from the substrate motherboard 11, and the organic layer 14 is formed on a surface of each metal layer 13 facing away from the substrate motherboard 11. The metal layer 13 includes the residual pattern 132 located in the transition region EE. The orthographic projection of the organic layer 14 on the substrate motherboard 11 is located outside cutting region DD, and the portion of the organic layer 14 located in the transition region EE covers the residual pattern 132 of the metal layer 13 in the same transition region EE.

In some embodiments, the display substrate motherboard includes at least two metal layers 13 and at least two organic layers 14. In this case, S300 includes:

forming at least two metal layers 13 and at least two organic layers 14 on the side of the at least one inorganic layer 12 facing away from the substrate motherboard 11. Each metal layer 13 and a respective organic layer 14 form a layer pair. In the layer pair, the organic layer 14 is disposed on a side of the metal layer 13 facing away from the substrate motherboard 11, and covers the residual patterns of the metal layer 13.

In some embodiments, the manufacturing method for the display substrate motherboard described above further includes step 400 (S400).

In S400, the conductive layer 15 is formed on the side of the organic layer(s) 14 facing away from the substrate motherboard 11. An orthographic projection of the conductive layer 15 on the substrate motherboard 11 is located in the display regions AA.

Here, in the case where the display substrate motherboard 11 includes the at least two metal layers 13 and the at least two organic layers 14, S400 includes: forming the conductive layer 15 on a surface of an outermost organic layer 14 facing away from the substrate motherboard 11.

In some embodiments, the conductive layer 15 may be formed by a wet etching process.

In order to more clearly describe the manufacturing method for the display substrate motherboard 1000 in the above embodiments, the display substrate motherboard 1000 as shown in FIG. 8 will be taken as an example for detailed description below. The manufacturing method for the display substrate motherboard 1000 is shown in (A) to (1) in FIG. 9.

Figure 9:
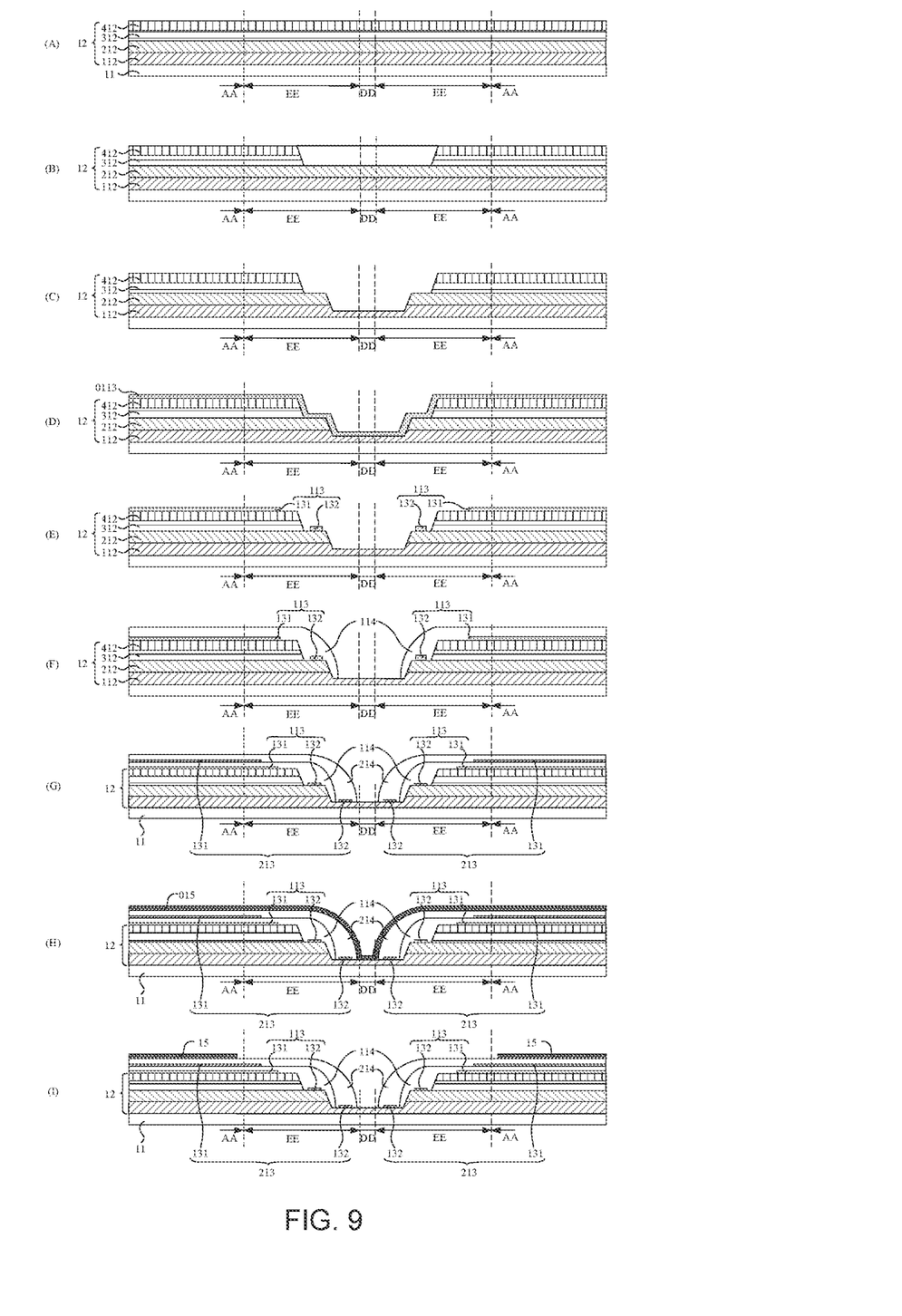
FIG. 9 is a process diagram of a method for manufacturing the display substrate motherboard shown in FIG. 8.

As shown in (A) in FIG. 9, the substrate motherboard 11 is provided, and the at least one inorganic layer 12 is deposited on the side of the substrate motherboard 11 by a plasma enhanced chemical vapor deposition (PECVD) process. For example, the barrier layer 112, the buffer layer 212, the gate insulating layer 312 and the interlayer insulating layer 412 are deposited in a direction away from the substrate motherboard 11.

As shown in (B) in FIG. 9, an opening etching is firstly performed on a portion of the at least one inorganic layer 12 located in the cutting region DD and the transition region EE through an etch bending A (EBA) mask.

As shown in (C) in FIG. 9, another opening etching is secondly performed on the portion of the at least one inorganic layer 12 located in the cutting region DD and the transition region EE through an etch bending B (EBB) mask.

As shown in (D) in FIG. 9, a first metal thin film 0113 is deposited on a surface of the at least one inorganic layer 12.

As shown in (E) in FIG. 9, the first metal thin film 0113 is patterned by using a wet etching process to obtain the first metal layer 113. The first metal layer 113 includes conductive patterns 131 and a residual pattern 132 located in the transition region EE.

As shown in (F) in FIG. 9, the first organic layer 114 is formed on the surface of the first metal layer 113, and the first organic layer 114 covers at least the residual pattern 132 of the first metal layer 113.

As shown in (G) in FIG. 9, similar to (D) to (F) in FIG. 9, a second metal thin film is formed on the surface of the first organic layer 114, and the second metal film is patterned by using a wet etching process to obtain the second metal layer 213. The second metal layer 213 includes conductive patterns 131 and a residual pattern 132 located in the transition region EE. Then, the second organic layer 214 is formed on a surface of the second metal layer 213, and the second organic layer 214 covers at least the residual pattern 132 of the second metal layer 213.

Of course, in a case where more metal layers and respective organic layers are provided in the display substrate motherboard 1000, the display substrate motherboard 1000 may be manufactured with reference to the above steps.

The metal thin film may be a single-layer metal thin film made of aluminum (Al), copper (Cu), molybdenum (Mo), titanium (Ti) or aluminum neodymium alloy (AlNd); or the metal thin film may be a multi-layer metal thin film made of combinations of at least two of aluminum (Al), copper (Cu), molybdenum (Mo), titanium (Ti), and aluminum-neodymium alloy (AlNd). For example, the metal thin film is a molybdenum-aluminum-molybdenum (Mo—Al—Mo) film or a titanium-aluminum-titanium (Ti—Al—Ti) film. In addition, the metal thin film may be deposited by a magnetron sputtering process.

As shown in (H) of FIG. 9, a conductive thin film 015 is deposited on a surface of the second organic layer 214.

As shown in (1) in FIG. 9, the conductive thin film 015 is patterned by a wet etching process to obtain the conductive layer 15.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
a substrate;
at least one inorganic film disposed on the substrate; at least one edge portion of the at least one inorganic film being step-shaped;
at least one metal film disposed on a side of the at least one inorganic film facing away from the substrate; a metal film of the at least one metal film including a conductive pattern and at least one residual pattern, and an orthographic projection of a residual pattern of the at least one residual pattern on the substrate being located within an orthographic projection of a step-shaped edge portion of the at least one step-shaped edge portion of the at least one inorganic film on the substrate, wherein the residual pattern is an un-etched portion of the metal film on the step-shaped edge portion of the at least one step-shaped edge portion of the at least one inorganic film; and
at least one organic film; an organic film of the at least one organic film being disposed on a side of the metal film facing away from the substrate, and an edge portion of the organic film completely covering the residual pattern of the metal film; wherein
the at least one metal film includes at least two metal films, and the at least one organic film includes at least two organic films;
each metal film and a respective organic film form a film pair; in the each film pair, the organic film is disposed on a side of the metal film facing away from the substrate, and covers the residual pattern of the metal film;

in the at least two metal films, two adjacent metal films are a first metal film and a second metal film, the second metal film is disposed at a side of the first metal film facing away from the substrate; in the at least two organic films, an organic film between the first metal film and the second metal film is a first organic film;

a residual pattern of the second metal film is disposed on a surface of the first organic film facing away from the substrate, and/or disposed on a surface of a portion, not covered by the first organic film, of the step-shaped edge portion of the at least one inorganic film.

2. The display substrate according to claim 1, wherein in a direction parallel to the substrate and pointing from a center of the at least one inorganic film to a boundary of the step-shaped edge portion of the at least one inorganic film, a thickness of the step-shaped edge portion of the at least one inorganic film decreases in a stepped manner.

3. The display substrate according to claim 1, wherein an orthographic projection of a boundary of the step-shaped edge portion of the at least one inorganic film on the substrate approximately coincides with a boundary of a respective side of the substrate; and/or
a space exists between an orthographic projection, on the substrate, of a boundary of the edge portion of the organic film covering the residual pattern and a boundary of a respective side of the substrate.

4. The display substrate according to claim 1, wherein the at least one inorganic film includes at least one of a barrier film, a buffer film, a gate insulating film and an interlayer insulating film.

5. The display substrate according to claim 1, wherein a conductive pattern of the first metal film includes:
at least one conductive electrode including at least one of a source and a drain; and
at least one signal line including at least one of a data signal line, a voltage signal line, a clock signal line, and a sensing signal line;
a conductive pattern of the second metal film includes at least one of at least one connection electrode, at least one initialization signal line and at least one auxiliary signal line.

6. The display substrate according to claim 1, wherein in a thickness direction of the substrate and away from the substrate, the step-shaped edge portion of the at least one inorganic film includes a first step, a second step and a third step;
an outer boundary of the second step is indented toward a middle of the substrate relative to an outer boundary of the first step, and an outer boundary of the third step is indented toward the middle of the substrate relative to the outer boundary of the second step.

7. The display substrate according to claim 6, wherein in the at least two organic films, an organic film on a side of the second metal film facing away from the substrate is a second organic film;
a residual pattern of the first metal film is located on the second step;
an edge portion of the first organic film extends onto the first step;
the residual pattern of the second metal film is located on the first step;
an edge portion of the second organic film at least partially covers the first step.

8. The display substrate according to claim 6, wherein the at least one inorganic film includes a barrier film, a buffer film, a gate insulating film and an interlayer insulating film that are stacked in sequence;
the barrier film includes a main body portion and at least one edge portion, an edge portion of the at least one edge portion of the barrier film includes a connection portion connected to the main body portion of the barrier film, and a recess portion located on a side of the connection portion away from the main body portion of the barrier film, a thickness of the connection portion is greater than a thickness of the recess portion; the recess portion constitutes the first step;
a boundary of an orthographic projection of the buffer film on the barrier film approximately coincides with a boundary of the connection portion of the barrier film; an edge portion of the buffer film close to the recess portion and the connection portion together constitute the second step;
a boundary of an orthographic projection of the gate insulating film on the buffer film and a respective boundary of an orthographic projection of the interlayer insulating film on the buffer film are located on a side of a boundary of the buffer film proximate to the middle of the buffer film; an edge portion of the gate insulating film and an edge portion of the interlayer insulating film that are close to the recess portion together constitute the third steps.

9. The display substrate according to claim 8, wherein the interlayer insulating film includes a first interlayer insulating sub-film and a second interlayer insulating sub-film, and the second interlayer insulating sub-film is disposed on a side of the first interlayer insulating sub-film facing away from the substrate;
the display substrate further comprises:
a semiconductor pattern disposed on a surface of the buffer film facing away from the substrate;
a first gate pattern disposed on a surface of the gate insulating film facing away from the substrate, the first interlayer insulating sub-film covering the first gate pattern; and
a second gate pattern disposed on a surface of the first interlayer insulating sub-film facing away from the substrate, the second interlayer insulating sub-film covering the second gate pattern, wherein
a conductive pattern of the first metal film is located on a surface of the second interlayer insulating sub-film facing away from the substrate, and a conductive electrode of the conductive pattern of the first metal film is connected to the semiconductor pattern.

10. The display substrate according to claim 1, further comprising:
a passivation film, wherein
the passivation film is disposed on a side of a conductive pattern of an innermost metal film facing away from the substrate, and an innermost organic film is located on a side of the passivation film facing away from the substrate.

11. The display substrate according to any of claim 1, further comprising an electrode film, wherein an orthographic projection of an edge portion of the electrode film on the substrate does not overlap with the orthographic projection of the step-shaped edge portion of the at least one inorganic film on the substrate; and the electrode film is disposed on a surface of an outermost organic film facing away from the substrate.

12. The display substrate according to claim 11, wherein the electrode film includes an anode of at least one light-emitting device.

13. A display device, comprising the display substrate according to claim 1.

14. A display substrate motherboard having a plurality of display regions, a cutting region located between every two adjacent display regions, and a transition region located between each display region and a respective cutting region, the display substrate motherboard comprising:
- a substrate motherboard;
- at least one inorganic layer disposed on the substrate motherboard; a portion of the at least one inorganic layer located in the transition region being step-shaped;
- at least one metal layer disposed on a side of the at least one inorganic layer facing away from the substrate motherboard; a metal layer of the at least one metal layer including conductive patterns and residual patterns, and an orthographic projection of a residual pattern on the substrate motherboard being located within an orthographic projection of the step-shaped portion of the at least one inorganic layer on the substrate motherboard, wherein the residual pattern is an un-etched portion of the metal layer on the step-shaped portion of the at least one inorganic layer; and
- at least one organic layer; an organic layer of the at least one organic layer being disposed on a side of the metal layer facing away from the substrate motherboard; an orthographic projection of the organic layer on the substrate motherboard being located outside the cutting region, and a portion of the organic layer located in the transition region completely covering the residual pattern of the metal layer in the same transition region; wherein
- a thickness of the step-shaped portion of the at least one inorganic layer decreases in a stepped manner in a direction close to a respective cutting region; a minimum thickness of the step-shaped portion of the at least one inorganic layer is greater than or equal to a thickness of a portion of the at least one inorganic layer located in the cutting region; wherein
- the at least one metal layer includes at least two metal layers, and the at least one organic layer includes at least two organic layers;
- each metal layer and a respective organic layer form a layer pair; in the layer pair, the organic layer is disposed on a side of the metal layer facing away from the substrate motherboard, and covers the residual patterns of the metal layer;
- in the at least two metal layers, two adjacent metal layers include a first metal layer and a second metal layer, and the second metal layer is disposed at a side of the first metal layer facing away from the substrate motherboard; in the at least two organic layers, an organic layer between the first metal layer and the second metal layer is a first organic layer;
- a residual pattern of the second metal layer is disposed on a surface of the first organic layer facing away from the substrate motherboard, and/or disposed on a surface of a portion, not covered by the first organic layer, of the step-shaped portion of the at least one inorganic layer.

15. The display substrate motherboard according to claim 14, further comprising a conductive layer, an orthographic projection of the conductive layer on the substrate motherboard being located in the display regions; wherein the conductive layer is disposed on a surface of an outermost organic film facing away from the substrate motherboard.

16. A manufacturing method for the display substrate motherboard, applied to manufacturing of the display substrate motherboard according to claim 14, the manufacturing method comprising:
- providing the substrate motherboard;
- forming the at least one inorganic layer on the side of the substrate motherboard, and the portion of the at least one inorganic layer located in the transition region being step-shaped;
- forming the at least one metal layer on the side of the at least one inorganic layer facing away from the substrate motherboard; and
- forming the organic layer on a surface of each metal layer facing away from the substrate motherboard, wherein the metal layer includes the residual pattern located in the transition region, and the residual pattern is an un-etched portion of the metal layer on the step-shaped portion of the at least one inorganic layer; the orthographic projection of the organic layer on the substrate motherboard is located outside the cutting region, and the portion of the organic layer located in the transition region completely covers the residual pattern of the metal layer in the same transition region; wherein
- forming the at least one metal layer on the side of the at least one inorganic layer facing away from the substrate motherboard, and forming the organic layer on the surface of each metal layer facing away from the substrate motherboard, includes:
- forming at least two metal layers and at least two organic layers on the side of the at least one inorganic layer facing away from the substrate motherboard, wherein each metal layer and a respective organic layer form a layer pair; in the layer pair, the organic layer is disposed on a side of the metal layer facing away from the substrate motherboard, and covers the residual patterns of the metal layer.

17. The manufacturing method for the display substrate motherboard according to claim 16,
further comprising: forming a conductive layer on a side of the at least one organic layer facing away from the substrate motherboard, an orthographic projection of the conductive layer on the substrate motherboard being located in the display regions; wherein forming the conductive layer on the side of the at least one organic layer facing away from the substrate motherboard, includes:
- forming the conductive layer on a surface of an outermost organic layer facing away from the substrate motherboard.

* * * * *